(12) United States Patent
Takahashi

(10) Patent No.: US 8,603,630 B2
(45) Date of Patent: Dec. 10, 2013

(54) RADIATION-CURABLE ADHESIVE COMPOSITION AND ADHESIVE SHEET

(75) Inventor: Tomokazu Takahashi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 22 days.

(21) Appl. No.: 13/337,549

(22) Filed: Dec. 27, 2011

(65) Prior Publication Data

US 2012/0165489 A1 Jun. 28, 2012

(30) Foreign Application Priority Data

Dec. 28, 2010 (JP) ................................ 2010-291717

(51) Int. Cl.
*C08F 2/46* (2006.01)
*B32B 27/08* (2006.01)

(52) U.S. Cl.
USPC ..................... 428/355 AC; 522/116; 522/152

(58) Field of Classification Search
USPC ............................ 428/355 AC; 522/116, 152
See application file for complete search history.

(56) References Cited

U.S. PATENT DOCUMENTS

| | | | |
|---|---|---|---|
| 5,670,226 A * | 9/1997 | Yoshizawa et al. | 428/40.1 |
| 6,984,413 B2 | 1/2006 | Yamamoto et al. | |
| 2003/0012949 A1 | 1/2003 | Yamamoto et al. | |
| 2006/0257651 A1 | 11/2006 | Shintani et al. | |
| 2009/0075008 A1 * | 3/2009 | Hwang et al. | 428/41.7 |

FOREIGN PATENT DOCUMENTS

| | | |
|---|---|---|
| EP | 1411547 A2 | 4/2004 |
| EP | 1583144 A2 | 10/2005 |
| EP | 2151857 A2 | 2/2010 |
| EP | 2151860 A2 | 2/2010 |
| JP | 2001-234136 A | 8/2001 |
| JP | 2005-019607 A | 1/2005 |
| JP | 2007-220694 A | 8/2007 |

* cited by examiner

*Primary Examiner* — Vu A Nguyen
(74) *Attorney, Agent, or Firm* — Sughrue Mion, PLLC

(57) ABSTRACT

A radiation-curable adhesive composition having a base polymer including structural units derived from a monomer A having a functional group a; a monomer B formed from a methacrylate monomer having an alkyl group that includes at least 10 and no more than 17 carbon atoms; and a monomer C that has both a functional group c that reacts with the functional group a and a polymerizable carbon-carbon double bond group, and a main chain of the base polymer is configured from the monomer B and the monomer A, the proportion of the monomer B being at least 50 wt % of the total monomers configuring the main chain; and the base polymer includes a polymerizable carbon-carbon double bond group in a side chain as a result of a portion of the functional group a in the monomer A reacting and bonding with the functional group c in the monomer C.

11 Claims, No Drawings

RADIATION-CURABLE ADHESIVE COMPOSITION AND ADHESIVE SHEET

CROSS-REFERENCE TO RELATED APPLICATIONS

This application claims priority to Japanese Application No. 2010-291717 filed in Japan on Dec. 28, 2010. The entire disclosures of Japanese Application No. 2010-291717 is incorporated hereinto by reference.

BACKGROUND OF THE INVENTION

1. Field of the Invention

The present invention relates to a radiation-curable adhesive composition and an adhesive sheet.

2. Background Information

The radiation-curable adhesive composition facilitates a peeling operation by reducing adhesive characteristics from a state of strong adhesive characteristics as a result of curing by exposure to radiation.

Thus, use is preferred in relation to applications that require the contrary characteristics of strong adhesive performance and ease of peeling. For example, an adhesive sheet is provided with an adhesive layer formed by the above type of radiation-curable adhesive composition, and is adhered to the surface of an adherend to thereby protect and fix that surface. When no longer required, the adhesive characteristics are reduced as a result of curing the adhesive agent by irradiation with radiation of the adhesive sheet attached to the adherend to thereby facilitate peeling by a gentle peeling operation of the adhesive sheet.

In particular, during dicing, an adhesive sheet used for dicing of a semiconductor wafer or the like requires an adhesive force of a level that does not allow peeling from the semiconductor wafer and an adhesive force of a level to prevent detachment from the dicing ring used for retaining the wafer. On the other hand, when executing a pick-up operation after dicing, it is necessary to facilitate peeling with an adhesive force that is sufficiently low to prevent damage to the semiconductor wafer.

As a result, various adhesive sheets have been proposed (for example, see JP2005-19607A and JP2007-220694A).

Furthermore, an adhesive sheet used for dicing requires low contamination characteristics such as avoidance of residual adhesive on the semiconductor wafer, and re-peelable sheets have been proposed in an attempt to meet both these characteristics (for example, JP2001-234136A).

Normally, a pick-up operation after dicing is executed after performance of an expanding step in which the interval between each semiconductor chip is increased. The expanding step is a step of forming a configuration in which peeling of the semiconductor chip from the adhesive sheet used for dicing is facilitated. Furthermore, this step is executed by creating a configuration in which the adhesive sheet for dicing is stretched to a certain extent and the adhesive sheet for dicing at the bottom portion of the semiconductor chip to be picked up is lifted up in a point condition or linear condition (normally termed "raising"). In recent years, a pick-up method has been mainly used in which the semiconductor chip is placed in this type of easily peelable state, and then picked up by vacuum attachment from the upper side.

As described above, the increased reduction in the thickness and weight of the semiconductor product or the increased reduction in the thickness of the semiconductor wafer as a result of enhanced integration has caused an increase in the risk of damage to the semiconductor wafer as a result of a deformation resulting from raising of the adhesive sheet during the pick-up process.

Therefore, there is a need for a method of enabling a safe pick-up operation that does not cause damage to the chip during a slight raising operation.

SUMMARY OF THE INVENTION

The present invention is proposed in light of the above problems and has the object of providing a radiation-curable adhesive composition that is used in an adhesive sheet used for dicing that enable enhanced pick-up of a semiconductor chip with a slight raising operation, and an adhesive sheet using the radiation-curable adhesive composition.

The present inventions include [1] to [9] as follows.

[1] A radiation-curable adhesive composition having a base polymer as a principal base material, the base polymer includes structural units derived from at least a monomer A that has a functional group a;

a monomer B that is formed from a methacrylate monomer that has an alkyl group that includes at least 10 and no more than 17 carbon atoms; and a monomer C that has both a functional group c that reacts with the functional group a and a polymerizable carbon-carbon double bond group, and a main chain of the base polymer is configured from the monomer B and the monomer A, the proportion of the monomer B being at least 50 wt % of the total monomers configuring the main chain; and the base polymer includes a polymerizable carbon-carbon double bond group in a side chain as a result of a portion of the functional group a in the monomer A reacting and bonding with the functional group c in the monomer C.

[2] The radiation-curable adhesive composition according to [1], wherein the polymer that configures a main chain from structural units derived from the monomer A and the monomer B has a calculated glass transition temperature that is calculated from a Fox equation at no more than 260 K.

[3] The radiation-curable adhesive composition according to [1] or [2], wherein the functional group a is a hydroxyl group and the functional group c is an isocyanate group.

[4] The radiation-curable adhesive composition any one of according to [1] to [3], wherein the monomer C is 2-isocyanatoethyl acrylate and/or 2-isocyanatoethyl acrylate.

[5] The radiation-curable adhesive composition any one of according to [1] to [4], wherein the monomer A is at least one monomer selecting the group consisting of 2-hydroxyethyl methacrylate, 2-hydroxypropyl methacrylate and 6-hydroxyhexyl methacrylate.

[6] The radiation-curable adhesive composition any one of according to [1] to [5], wherein the monomer B is at least one monomer selecting the group consisting of dodecyl methacrylate and tridecyl methacrylate.

[7] The radiation-curable adhesive composition any one of according to [1] to [6], wherein the monomer B is dodecyl methacrylate.

[8] The radiation-curable adhesive composition any one of according to [1] to [7], wherein the number of polymerizable carbon-carbon double bonds introduced into the side chain that derived from the monomer C is at least 5% and no more than 20% of the total number of side chains in the base polymer.

[9] An adhesive sheet comprising a adhesive layer including the radiation-curable adhesive composition any one of according to [1] to [8].

According to the radiation-curable adhesive composition of the present invention, it is possible to provide a radiation-curable adhesive composition that is used in an adhesive sheet used for dicing that enable enhanced pick-up of a semiconductor chip with a slight raising operation and an adhesive sheet using radiation-curable adhesive composition.

DETAILED DESCRIPTION OF THE PREFERRED EMBODIMENTS

The radiation-curable adhesive composition according to the present invention includes a base polymer that has structural units derived from at least three types of monomers including monomer A to monomer C, as a principal base material. As used herein, "principal base material" means inclusion at a maximum weight percent in the base material that constitutes the radiation-curable adhesive composition according to the present invention, and is preferably included by at least 50% of the overall weight of the base material.

Monomer A: a monomer having a functional group a;

Monomer B: a methacrylate monomer having an alkyl group of at least 10 and no more than 17 carbon atoms;

Monomer C: a monomer having both groups of a functional group c that can react with the functional group a, and a polymerizable carbon-carbon double-bond group.

The base polymer is a polymer that has a polymerizable carbon-carbon double-bond in a side chain, and this feature is introduced since the monomer B configures the main chain with the monomer A in a proportion of at least 50 wt % of the total monomer forming the main chain, and a portion of the functional group a in the monomer A is reacted with and bonded to the functional group c in the monomer C.

That is to say, when synthesizing this type of base polymer, firstly, an intermediate polymer is obtained by copolymerization of the monomer A with the monomer B. At that time, a copolymerizable monomer other than the monomer A and the monomer B (however a substance other than monomer C is suitable) may be added, for example, in order to adjust the physical properties of the polymer.

The structural units derived from the monomer B in the intermediate polymer suitably have a proportion of at least 50 wt % of the total monomer. In other words, when polymerizing the monomer A and the monomer B, the configuration preferably satisfy Equation (1), wherein the weight ratio of the monomer A is denoted as WA(%) and the weight ratio of the monomer B is denoted as WB(%). When the monomer A and the monomer B include a plurality of types of monomers, respectively, the weight ratios WA and WB respectively mean the total weight of the monomer A and the monomer B.

$$WB/(1-WA) \geq 50\% \quad (1)$$

Next, monomer C is added to the intermediate polymer, and the polymerizable carbon-carbon double-bond group is added to the side chain of the intermediate polymer by reacting the functional group a with the functional group c to thereby obtain the base polymer. At this time, a catalyst may be added to promote the reaction depending on the combination of the functional group a with the functional group c, and when required, energy such as heat may be added from an external source.

There is no particular limitation of kind of the monomer A as long as the monomer A includes the functional group a, and it is capable of copolymerization with the monomer B.

The functional group includes a carboxyl group, an epoxy group (in particular, a glycidyl group), an aziridyl group, a hydroxyl group and an isocyanate group. Of the above, a hydroxyl group, an isocyanate group, and the like are preferred, and a hydroxyl group is still more preferred.

When the functional group a is a carboxyl group, the monomer A includes methacrylic acid, carboxyethyl(meth)acrylate, carboxypentyl(meth)acrylate, itaconic acid, maleic acid, fumaric acid, crotonic acid, and the like.

When the functional group a is a glycidyl group, the monomer A includes glycidyl(meth)acrylate, methylglycidyl (meth)acrylate, and the like.

When the functional group a is a hydroxyl group, the monomer A includes hydroxy group containing monomers such as 2-hydroxyethyl(meth)acrylate, 3-hydroxypropyl (meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, (4-hydroxymethyl cyclohexyl)methyl(meth)acrylate; ether compounds such as 2-hydroxyethyl vinyl ether, 4-hydroxybutyl vinyl ether, diethyleneglycol monovinyl ether, and the like. Of such compounds, 2-hydroxyethyl(meth)acrylate, 2-hydroxyopropyl(meth)acrylate, and 6-hydroxyhexyl (meth)acrylate are preferred in light of copolymerization characteristics with monomer B which is a methacrylate monomer as described below and is associated with ease of acquisition of starting materials.

When the functional group a is an isocyanate group, the monomer A includes methacryloyl isocyanate, 2-isocyanatoethyl methacrylate, acryloyl isocyanate, 2-isocyanatoethyl acrylate, m-isopropenyl-α,α-dimethyl benzyl isocyanate, and the like.

These compounds may be used singly or in combinations of two or more.

The monomer A exhibits a tendency to cause difficulty of handling of the intermediate polymer due to the action of intermolecular forces represented by the hydrogen bonds between the side chains as a result of the above functional groups, and therefore, it is preferred that the monomer A is no more than 15 wt % relative to the overall intermediate polymer.

In the specification of the present application, the term "(meth)acrylate" denotes the inclusion of both acrylate and methacrylate.

The monomer B is a methacrylate monomer having an alkyl group of at least 10 and no more than 17 carbon atoms.

The adhesive force after irradiation can be suppressed to a low value when the number of carbons in the alkyl group is no more than 10. This effect is proposed to result from lack of a tendency of the polarity of the ester bonds in proximity to the main chain to be affected by electrical attraction to the adherend.

On the other hand, when the number of carbon atoms in the side chain is at least 8, the glass transition temperature increases as the number of carbon atoms in the acrylate monomer increases. This effect is proposed to result from the crystalline characteristics of the side chain. As a result, the adhesive characteristics prior to irradiation are reduced, and thereby adversely affects the storage characteristics prior to irradiation.

In the methacrylate monomer, even when the number of carbons in the side chain is 10 or more, the glass transition temperature is low, and the number of carbons in the side chain can be increased and an effect of the ethyl bonds in proximity to the main chain can be inhibited without an adverse effect on the storage characteristics prior to irradiation. However, even when using the methacrylate monomer, if the number of carbons in the side chain is 18 or more, the glass transition temperature will increase and the storage characteristics prior to irradiation will be reduced.

Example of such alkyl groups include straight or branched alkyl groups such as decyl, undecyl, dodecyl, tridecyl, tetradecyl, pentadecyl, hexadecyl, heptadecyl, 1-methyl nonyl, 1-ethyl decyl, 1,2-dimethyl octyl, 1,2-diethyl hexyl, and the like.

Therefore, monomer B includes decyl methacrylate, dodecyl methacrylate, tridecyl methacrylate, octadecyl methacrylate, and the like. Of these compounds, dodecyl methacrylate or tridecyl methacrylate are preferred, and dodecyl methacrylate being still more preferred. These compounds may be used singly or in combinations of two or more. The selection of these monomers facilitates control of the calculated glass transition temperature as described below to 260 K or less, then enables an increase to the adhesive force prior to irradiation.

The adhesive force after irradiation in the adhesive composition according to the present invention can be reduced by use of a polymer that is derived from a relatively long methacrylate monomer such that the number of carbons in the alkyl group is at least 10 and no more than 17. As a result, a superior pick-up operation is enabled in relation to semiconductor chip or the like using a lower level of raising.

Although the adhesive force after irradiation can be reduced by using an acrylate monomer that has an alkyl group with at least 10 and no more than 17 carbon atoms, a polymer generated from an acrylate monomer that has a large number of carbon atoms in a side chain exhibits conspicuous crystalline properties due to the alkyl group in the side chain. As a result, the glass transition temperature increases, and the adhesive force at ambient temperature prior to irradiation is reduced.

Therefore, the use of a methacrylate monomer that has an alkyl group with at least 10 and no more than 17 carbon atoms is particularly preferred in order to maintain the adhesive force prior to irradiation and enable a superior configuration as a radiation-curable adhesive composition.

Any compound may be used as the monomer C as long as it is a compound that includes both the functional group c that reacts with the functional group a, and a polymerizable carbon-carbon double bond. The functional group that reacts with functional group a includes the same examples that have been described in relation to functional group a.

The combination of functional group a and functional group c includes a carboxyl group and an epoxy group (in particular, a glycidyl group), a carboxyl group and an aziridyl group, a hydroxyl group and an isocyanate group, and the like. Of the above, a combination of a hydroxyl group and an isocyanate group is preferred. The selection of this combination enables inhibition of modification to the copolymer resulting from a high-temperature energy load due to the requirement to use high-temperature energy in order to react the monomer C that includes both the functional group c and a polymerizable carbon-carbon double bond with the functional group a in the monomer A.

The combination of these functional groups may combine any functional group a with the functional group c. It is preferred that the functional group a in the intermediate polymer is a hydroxyl group and the functional group c in the monomer C is an isocyanate group.

Therefore, when the functional group c is an isocyanate group, the monomer C includes the same compounds as in monomer A. Of those compounds, 2-isocyanatoethyl acrylate and/or 2-isocyanatoethyl acrylate are preferred. These compounds may be used singly or in combinations of two or more.

The polymer that has a main chain using structural units derived from monomer A and monomer B, that is to say, not the polymer in which a portion of the functional group a in the monomer A is reacted and bonded with the functional group c in monomer C but rather the polymer that has structural units derived from only monomer A and monomer B (however, a copolymerizing monomer other than the monomer A and monomer B may be used), in other words, the intermediate polymer described above, preferably includes a calculated glass transition temperature that is calculated from the equation for Fox at no more than 260 K. The calculated glass transition temperature can be adjusted by selection of the type and amount or the like of the monomer A and monomer B (or another arbitrary copolymerizing monomer).

The calculated glass transition temperature (calculated Tg) can be calculated from the Fox equation (2).

$$1/\text{calculated } Tg = W1/Tg(1) + W2/Tg(2) + \ldots Wn/T(n) \quad (2)$$

wherein W1, W2, . . . Wn means the respective weight ratios relative to the polymer of the component (1), component (2), . . . component (n), and the Tg(1), Tg(2) . . . T(n) expresses the glass transition temperature (units in absolute temperature) of the homopolymer of the component (1), component (2), . . . component (n).

The glass transition temperature of the homopolymer is known from various publications, catalogues or the like, and for example, is disclosed in J. Brandup, E. H. Immergut, E. A. Grulke: Polymer Handbook: JOHN WILEY & SONS, INC. Values measured by general thermal analysis, for example, differential thermal analysis, a dynamic viscoelastic measurement method, or the like may be used in relation to a monomer for which the respective publications include no values.

The adhesive properties prior to irradiation can be increased by setting the calculated glass transition temperature to this range. Therefore, it is possible to prevent peeling of the semiconductor wafer when an adhesive sheet that includes an adhesive layer that is formed from the radiation-curable adhesive composition of the present invention is used as a dicing sheet. Furthermore, the adhesive properties of the semiconductor wafer to the dicing frame can be increased to thereby enable prevention of unintended peeling from the frame.

The number of polymerizable carbon-carbon double bonds introduced into the side chain that derived from the monomer C is suitably at least 5% and no more than 20% of the total number of side chains in the base polymer, and is preferably at least 7% and no more than 18%, and still more preferably at least 7% and no more than 15%.

The number of polymerizable carbon-carbon double bonds introduced into the side chain in the base polymer may be controlled by the addition ratio of the monomer C. Suitable curing characteristics can be imparted by irradiation when the polymerizable carbon-carbon double bonds are at least 5%. Furthermore, when no more than 20%, unintended curing can be prevented within the suitable range for the amount of polymerizable carbon-carbon double bonds present in the adhesive composition. Furthermore, deterioration of the adhesive properties prior to irradiation and a sharp reduction in the adhesive force can be prevented. Therefore, when the adhesive sheet that uses the adhesive composition according to the present invention as an adhesive layer is used as a dicing sheet, unintended peeling of the semiconductor wafer can be prevented and it is possible to improve pick-up characteristics after irradiation.

In the present invention, as described above, it is preferred that the present invention includes a copolymerizing monomer such as one or more types of monomer selected from 2-hydroxyethyl methacrylate, 2-hydroxyopropyl methacrylate, and 6-hydroxyhexyl methacrylate. It is preferred that a copolymerizing monomer other than these copolymerizing monomers is configured as a methacrylate-containing copolymer in which the proportion of dodecyl methacrylate and/or tridecyl methacrylate is at least 50 wt %. Furthermore it is preferred that the radiation-curable adhesive composition that is used as the principal material is a polymer obtained by reacting 2-isocyanatoethyl methacrylate and/or 2-isocyanatoethyl acrylate with at least a portion of the hydroxyl group of the hydroxyl group-containing methacrylate monomer.

In addition to the monomer A and the monomer B, the base polymer in the radiation-curable adhesive composition according to the present invention may include a structural unit derived from a monomer that is capable of copolymerizing (hereinafter referred to as "copolymerizing monomer") as a structural unit that configures the main chain. In other words, when the intermediate compound described above is synthesized, a copolymerizing monomer other than monomer C may be used. For example, this type of monomer may impart property modifications such as cohesive strength, heat resistance, glass transition temperature, adhesive force prior to irradiation, and the like.

The copolymerizing monomer includes a (meth)acrylate of a saturated hydrocarbon. The saturated hydrocarbon includes, for example, a $C_1$ to $C_{30}$ hydrocarbon, preferably a $C_1$ to $C_{18}$ hydrocarbon, and more preferably a $C_4$ to $C_{18}$ hydrocarbon.

Examples of the saturated hydrocarbon includes an alkyl group, cycloalkyl group and a combination thereof, in particular, alkyl(meth)acrylate, cycloalkyl(meth)acrylate and the like.

Examples of the alkyl group include methyl, ethyl, butyl, 2-ethylhexyl, octyl, decyl, dodecyl, tridecyl, octadecyl and the like.

Examples of the cycloalkyl group include cyclopropul, cyclobutyl, cyclohexyl and the like.

Further the copolymerizing monomer may include carboxyl group-containing monomers such as (meth)acrylic acid, carboxy ethyl(meth)acrylate, carboxy pentyl(meth)acrylate, itaconic acid, maleic acid, fumaric acid, crotonic acid, and the like; acid anhydride monomers such as maleic anhydride, itaconic anhydrous, and the like; sulfonic group-containing monomers such as styrene sulfonic acid, allyl sulfonic acid, 2-(meth)acrylic amide-2-methyl propanesulfonic acid, (meth)acrylamide propanesulfonic acid, sulfopropyl(meth)acrylate, (meth)acryloyloxynaphthalene sulfonic acid, and the like; phosphate group-containing monomers such as 2-hydroxyethyl acryloyl phosphate, and the like; acrylic amide, acrylonitrile, and the like.

Of such monomers, a methacrylate monomer is preferred in light of copolymerization with monomer B that is a methacrylate monomer. These compounds may be used singly or in combinations of two or more.

The amount of the copolymerizing monomer that is used is preferably no more than 40 wt % of the total monomer component that configures the main chain. As used herein, the term "total monomer component" means the monomer component that configures the main chain.

The structural units that are derived from the copolymerizing monomer may be included in the side chain as described below.

The base polymer in the radiation-curable adhesive composition according to the present invention may include use as required of a multifunctional monomer as the copolymerizing monomer component for the purpose of forming cross links. The structural units that are derived from this multifunctional monomer may be introduced into either the main chain or the side chain.

Examples of the multifunctional monomer include hexanediol di(meth)acrylate, polyethylene glycol di(meth)acrylate, polypropylene glycol di(meth)acrylate, neopentylglycol di(meth)acrylate, pentaerythritol di(meth)acrylate, trimethylol propane tri(meth)acrylate, pentaerythritol tri(meth)acrylate, dipentaerythritol hexa(meth)acrylate, epoxy(meth)acrylate, polyester(meth)acrylate, urethane(meth)acrylate, and the like.

These monomers may be used singly or in combinations of two or more.

In view of adhesive characteristics or the like, the amount of the multifunctional monomer that is used is preferably no more than 30 wt % of the total monomer component that configures the main chain.

As described above, the base polymer in the radiation-curable adhesive composition according to the present invention is firstly formed by polymerizing a monomer mixture of at least two types of monomer A and B. Polymerization is performed in any method including solution polymerization, emulsion polymerization, bulk polymerization, suspension polymerization, and the like. Then it is preferred that the monomer C is subjected to addition polymerization in relation to the resulting polymer. In this manner, the monomer C can be effectively introduced into the side chain of the base polymer.

When an adhesive sheet that includes the radiation-curable adhesive composition according to the present invention as an adhesive layer is used as a dicing sheet, the adhesive layer preferably includes a smaller content amount of low-molecular weight substances in light of preventing contamination of the semiconductor wafer or the like. Therefore, the weight average molecular weight of the base polymer is preferably at least 300,000, and more preferably 500,000 to 3,000,000. The weight average molecular weight means the polystyrene conversion value obtained from gel permeation chromatography.

The radiation-curable adhesive composition according to the present invention may use an external cross linking agent in order to increase the weight average molecular weight of the base polymer. The external cross linking agent includes a so-called cross-linking agent such as a polyisocyanate compound, an epoxy compound, an aziridine compound, a melamine resin, a urea resin, an anhydrous compound, a polyamine, and a carboxyl-containing compound, or the like. These external cross linking agents enable cross linking by addition to the base polymer.

When using an external cross linking agent, the amount used may be suitably adjusted in accordance to the application of the use of the adhesive in a balance with the base polymer to be cross linked. Generally, it is preferred that 0.01 to 10 parts by weight is blended with 100 parts by weight of the base polymer.

In addition to the base polymer, the radiation-curable adhesive composition according to the present invention may include an addition of an irradiation-curable monomer or oligomer from the point of view of adjusting the adhesive characteristics before and after irradiation.

Examples of the irradiation-curable monomer or oligomer include trimethylol propane tri(meth)acrylate, pentaerythritol tri(meth)acrylate, tetraethylene glycol di(meth)acrylate, 1,6-hexanediol(meth)acrylate, neopentylglycol di(meth)acrylate, ester of (meth)acrylic acid and polyol, ester acrylate oligomer; 2-propenyl-3-butenylcyanurate; isocyanurate, an isocyanurate compound, dipentaerythritol hexa(meth)acrylate, and the like.

These may be used singly or in combinations of two or more.

Although there is no particular limitation on the composition amount of the irradiation-curable monomer or oligomer component, during pick-up operations, that is to say, during peeling off in relation to the processed body after irradiation, and when it is considered that there is a reduction in the adhesive force, a composition of 1 to 50 wt % in the adhesive composition is preferred, with 5 to 20 wt % being still more preferred. It is preferred that the viscosity of the irradiation-curable monomer or oligomer component suitably adjusted in accordance with the application of the adhesive agent.

A substance that has an effect of being excited and activated by irradiation with ultraviolet radiation to thereby generate radicals and cause radical polymerization to cure the irradiation-curable monomer or oligomer described above is preferably added to the adhesive layer as a photo-polymerization initiating agent. In this manner, when adhering the adhesive sheet described below, adhering is facilitated by imparting plastic flow characteristics to the adhesive by use of the monomer or oligomer components. Therefore, during peeling of the adhesive sheet, the adhesive layer can be cured by irradiation with radiation and the adhesive force can be effectively reduced.

Examples of the photo-polymerization initiating agent include benzoin alkyl eters such as benzoin methyl ether, benzoin ethyl ether, benzoin propyl ether, benzoin isopropyl ether, benzoin isobutyl ether, and the like; aromatic ketones such as benzyl, benzoin, benzophenone, α-hydroxy cyclohexyl phenyl ketones, and the like; aromatic ketals such as benzyl dimethyl ketal, and the like; thioxanthones such as polyvinyl benzophenone, chlorothioxanthone, dodecyl thioxanthone, dimethyl thioxanthone, diethyl thioxanthone, and the like.

When using the photo-polymerization initiating agent, it is preferred that 0.1 to 15 parts by weight is blended with 100 parts by weight of the base polymer constituting the adhesive.

The base polymer in the radiation-curable adhesive composition according to the present invention, as required, may include conventional and known addition agents such as a tackifier, an antioxidant, a bulking agent, a coloring agent, a polymerization initiating agent, and the like.

The radiation-curable adhesive composition according to the present invention facilitates a reduction in the adhesive force by increasing the level of cross linking resulting from irradiation with radiation. The radiation includes various types such as electric waves, electron beams, infrared radiation, visible light, ultraviolet radiation, X-rays, gamma rays, or the like. Of these types, ultraviolet radiation, electron beams, and the like are preferred from the point of view of ease of handling, and ultraviolet radiation is still more preferred. For this purpose, a high-voltage mercury light, a low-voltage mercury light, a black light, or the like may be used. There is no particular limitation on the irradiation amount of the emitted rays for curing, and for example, it may be a level of at least 50 mJ/cm$^2$.

The adhesive sheet according to the present invention includes an adhesive layer having the radiation-curable adhesive composition described above. Normally, the adhesive layer is formed by disposition on one side of base film. Furthermore, a separator may be laminated on the adhesive layer on opposite side to the base film. However, these layers are not always configured as a single layer, but for example, there is an aspect that includes adhesive layers on both sides of the base film, an aspect that includes an intermediate layer, a primer layer or the like between the base film and the adhesive layer, an aspect that includes a charge prevention layer, a back-surface light-peeling processed layer, a friction reduction layer, a highly-adhesive processed layer, or the like on the back surface of the base film.

The adhesive sheet may be configured in a shape that is suitable for a use such in a sheet-shape, a roll-shape, or the like. For example, when used for wafer dicing, cutting and processing in advance into a predetermined shape is preferably used.

The base film is a strong mother body for the adhesive sheet.

There is no particular limitation in relation to the material used in the base film, and a film formed by a plastic material is particularly suitable.

Examples of the material of the base film includes polymers such as polyolefin (low-density polyethylene, linear polyethylene, medium density polyethylene, high-density polyethylene, super low-density polyethylene, random copolymerization polypropylene, block copolymerization polypropylene, homopolypropylene, polybutene, polymethyl pentene), ethylene-vinyl acetate copolymer, ionomer resin, ethylene-(meth)acrylate copolymer, ethylene-(meth)acrylic ester (random, alternation) copolymer, ethylene-butene copolymer, ethylene-hexene copolymer, polyurethane, polyester (polyethylene terephthalate), polyimide, polyether ketone, polystyrene, polyvinyl chloride, polyvinylidene chloride, fluoric resin, silicone resin, cellulose resin and these bridged resin, and the like. These may be used singly or in combinations of two or more.

The constituent material may use a graft as required formed from a functional group, a functional monomer, a modified monomer, or the like.

The base film may be a single layer, or a laminated layer of two or more types.

The surface of the base film for example may include a conductive layer formed from a metal, an alloy, an oxide compound or the like in order to impart a charge prevention function. The conductive layer in this configuration includes for example a deposited metal or the like, and has a thickness of 3 to 50 nm.

The base film preferably enables at least partial transmission of radiation for the purpose of irradiating the radiation-curable adhesive composition. As used herein, partial transmission means at least 50%, at least 60%, at least 70%, or at least 80%.

There is no particular limitation on the thickness of the base film, however it is generally 10 to 300 μm, and preferably 30 to 200 μm.

The base film may be formed as a film by use of a conventional and known method, and for example, includes a calendar film formation method, a casting film formation method, an inflation extrusion method, a T die extrusion method, and the like. When forming a laminated layer, a customary film lamination method may be used such as a co-extrusion method, a dry lamination method, and the like. The base film may be used without stretching, or may be subjected to uniaxial or biaxial stretching as required.

For the purpose of enhancing the retention properties or the sealing properties with the adjacent layer, the surface of the base film may be subjected to typical surface processing, for example, chemical or physical processing such as chromic acid processing, ozone exposure, flame exposure, high-voltage shock exposure, ionizing radiation processing, mat processing, corona exposure processing, primer processing, coating processing using a primer agent, cross-linking processing, or the like.

The adhesive layer is formed by the radiation-curable adhesive composition described above.

The thickness of the adhesive layer is preferably within the range of 1 to 50 μm. The adherend that is attached to the adhesive sheet may vibrate during processing (for example, during dicing). When the amplitude is large, a notch (chipping) or the like may be produced in the adherend (for example, a cut chip). However, when the thickness of the adhesive layer is no more than 50 μm, an excessive increase in the amplitude of the vibration produced during dicing or the like of the adherend or the like can be inhibited. As a result, a configuration is achieved in which production of a notch in the cut chip, that is to say, chipping can be reduced. On the other hand, when the thickness of the adhesive layer is at least 1 μm, retention of the adherend is ensured so that the adherend does not easily undergo peel during dicing or the like.

In particular, the adhesive layer is more preferably within the range of 3 to 20 μm. In this manner, a reducion in chipping can be further enhanced, and fixing of the processed object during dicing is more accurately executed to thereby prevent production of a malfunction during dicing.

A conventional and known method may be adopted as the method for formation of the adhesive layer, and for example, includes a method of direct coating of a constituent material for the adhesive layer onto the base film surface, and a method of coating and drying a constituent material for the adhesive layer onto a sheet coated with a peeling agent to thereby form the adhesive layer, and then transferring same onto the base film, or a similar method.

The separator includes the function of protecting the adhesive layer, label processing and smoothing the surface adhesive layer, and is formed as needed.

The constituent material of the separator includes paper, a synthetic resin film such as polyethylene, polypropylene, or polyethylene terephthalate, and the like. As required, a peeling process such as a silicone process, a long-chain alkyl process, a fluorine process, or the like may be executed to increase the peeling performance of the surface of the separator from the adhesive layer. Furthermore, as required, an ultraviolet protective process may be executed to prevent a reaction on the adhesive layer as a result of ultraviolet radiation. The thickness of the separator is normally 10 to 200 μm, and preferably is 25 to 100 μm.

The adhesive sheet according to the present invention may be used for adhesion to various adherends such as a semiconductor wafer, a semiconductor package, glass, a ceramic or the like.

Generally, after manufacture in a large diameter configuration, a semiconductor wafer composed of silicon, germanium, gallium arsenide, or the like is subjected to rear surface grinding (back grinding) to a predetermined thickness, and, as required, is subjected to back-surface processing (etching, polishing, and the like). Next, a dicing adhesive sheet that is fixed to a ring-shaped tool termed a dicing frame is attached to the back surface of the semiconductor wafer, and cutting and separation into component pieces (dicing) is performed. And then, various processing steps including a washing process, expanding process, pick-up process, and mounting process are executed.

The adhesive sheet according to the present invention may be preferably used in a manufacture process for this type of semiconductor devices, and for example, may be used as a surface protective sheet or fixing sheet for back grinding of a semiconductor wafer, a surface protective sheet or fixing sheet for dicing of a semiconductor wafer, a protective sheet for a semiconductor circuit, or the like.

More specifically, the adhesive sheet according to the present invention is firstly aligned and attached to a semiconductor wafer such as a semiconductor component or the like (mounting process). The mounting process is configured to stack the semiconductor wafer and the adhesive sheet so that the adhesive layer side is the adhered surface, and then press with a pressing means such as a pressing attachment roll, or the like. Furthermore, the semiconductor wafer and the adhesive sheet are introduced into a container that can be pressurized (for example, an autoclave, or the like), and thereby adhesion is enabled by pressurizing in the container. In this context, adhesion may be executed by pressing with a pressing means. Furthermore, adhesion may be executed in a vacuum chamber. Although there is no limitation in relation to an adhesion temperature or the like during adhesion processing, a temperature for example of 20 to 80 degrees C. is preferred.

Next, the semiconductor wafer is diced (dicing step). The dicing step is executed to manufacture as semiconductor chip by configuration of the semiconductor wafer into individual pieces. For example, dicing is executed by high speed rotation of a blade from the side mounting the circuit surface of the semiconductor wafer, and cutting of the semiconductor wafer into a predetermined size. Furthermore, a cutting method or the like that is termed a full cut in which cutting is executed up to the adhesive sheet may be employed. The cutting method may employ a known method such as a method using a high rotation speed blade, or a laser in the ultraviolet, infrared, visible spectrums, or the like, a method of forming a notch on the surface with a diamond cutter or the like, and partitioning with an external force, a method of forming a defect layer in an inner portion oriented with respect to the direction of thickness of the cut body and then partitioning with an external force, or the like. At that time, since adhesion and fixing is enabled by the adhesive sheet, chip fracture or chip fly of the semiconductor wafer can be suppressed, and damage to the semiconductor wafer can be suppressed.

Then, the semiconductor chip is picked up (pick-up process). The pick-up process is executed in order to peel the semiconductor chip that is adhered and fixed to the adhesive sheet. There is no particular limitation in relation to the pick-up method. Various conventional and known methods may be used, and for example, it includes a method in which individual semiconductor chips are raised upwardly from the adhesive sheet by a needle, and the raised semiconductor chips are picked up by a pick-up apparatus.

Before the pick-up operation, an irradiation process is applied to the adhesive layer. In this manner, the adhesive properties are reduced and the pick-up operation is facilitated. There is no particular limitation on the conditions such as the radiation intensity when executing irradiation, or the irradiation time, and such settings may be suitably determined as required.

The adhesive sheet and the radiation-curable adhesive composition according to the present invention will be described below in detail making reference to examples. In the following description, "parts" denotes parts by weight.

Firstly, the radiation-curable adhesive composition was prepared.

Preparation of Intermediate Polymer Solution

As shown in Table 2-1 and Table 3-1, a polymerization initiating agent and a solvent were placed in the presence of a predetermined monomer.

A thermal polymerization initiating agent of 0.2 wt % of 2,2'-azobis-isobutyronitrile (manufactured by Kishida Chemical Co., Ltd.) was used relative to the total amount of monomers. The solvent was used as 50 wt % relative to the total amount of monomers.

The mixture was introduced into a polymerization experimental apparatus including a 1 liter-separable distilling flask, a separable cover, a separating funnel, a thermometer, a nitrogen introduction pipe, a Liebig condenser, a vacuum seal, a stirring rod, and a stirring blade.

While stirring the mixture, the nitrogen was replaced hourly at an ambient temperature. Thereafter, while stirring during inflow of nitrogen, control was executed to maintain the solution temperature in the experimental apparatus with a water bath at 60 degrees C.±2 degrees C., and was maintained for 12 hours to thereby obtain an intermediate polymer.

During polymerization, toluene was dripped to control the temperature during polymerization. Ethyl acetate was dripped to prevent a rapid increase in viscosity resulting from hydrogen bonding caused by polar groups or the like in the side chains.

The calculated Tg(K) of the resulting intermediate polymer was calculated using the Fox equation and documentary values for Tg in the homopolymers shown in Table 1 and Table 3.

Preparation of Base Polymer

The resulting intermediate polymer solution was cooled to room temperature, and 2-isocyanatoethyl methacrylate (Karenz MOI; manufactured by Showa Denko K.K) and dibutyltin IV dilaurate (manufactured by Wako Pure Chemical Industries Limited) were added in the amounts shown in Table 1 and Table 3, and under an atmosphere of air, stirring was executed for 24 hours at 50 degrees C., and maintained to thereby obtain a polymer solution.

The number of double bonds with respect to the side chain was summarized in Table 1 and Table 3.

Preparation of Adhesive Solution

A photopolymerization initiating agent, and a polyisocyanate crosslinking agent are mixed and uniformly stirred into the resulting base polymer solution to thereby obtain an adhesive agent solution.

The photopolymerization initiating agent is added as 3 parts by weight of 1-hydroxycyclohexyl phenyl ketone (Irgacure 184 manufactured by Chiba Specialty Chemicals Inc.) to the base polymer, and a polyisocyanate crosslinking agent (Coronet L; manufactured by NIPPON POLYURETHANE INDUSTRY Co., Ltd.) is added by 3 parts by weight to the base polymer.

Preparation of Adhesive Sheet

The resulting adhesive solution is coated with an applicator onto a peel processed surface of a PET film that has been subjected to a silicon peel process, is dried for 5 minutes in a drying apparatus at 120 degrees C. to thereby obtain an adhesive layer having a thickness of 10 μm.

Then, a straight-chain low-density polyethylene resin is formed as a film as the base film by a T die extrusion method, and one surface is subjected to a corona process to thereby prepare a film having a thickness of 100 μm.

An adhesive layer is adhered with a hand roller to the surface of the base film subjected to corona processing, and tight adhesive processing is executed for 72 hours at a temperature of 50 degrees C. to thereby prepare an adhesive sheet.

Evaluation of pick-up was performed with respect to the resulting adhesive sheet, and the results are shown in Table 2 and Table 4.

Evaluation of Pick-Up

Under the following conditions, the resulting adhesive tape was attached together with an 8-inch dicing ring (2-8-1, manufactured by Disco Corporation) to the back-ground surface of a silicon mirror wafer that has been subjected to back grinding, the back-ground tape was peeled to thereby prepare a dicing work piece. The dicing work piece was left at ambient temperature in a dark location for 7 days.

Thereafter, dicing was executed under the following conditions. Peeling and release of the adhesive tape from the dicing ring was unsatisfactory at that point in time. In relation to those instances in which satisfactory dicing was executed, ultraviolet radiation was irradiated from the adhesive tape surface under the following conditions to thereby configure a work piece for evaluation of pick-up. Three hours after irradiation, evaluation of pick-up was performed under the following conditions. The needle height was executed at 150 μm, and when pick-up was not possible, the needle height was increase in 10 μm intervals and pick-up characteristics were evaluated at a needle height when continuous pick-up was enabled in relation to 50 chips. Therefore, the present evaluation value shows that pick-up characteristics for the adhesive tape improve as the value becomes smaller. A needle height of no more than 250 μm was taken as satisfactory pick-up, and a value of greater than 250 μm was unsatisfactory pick-up.

Back Grinding Conditions
    Device: DFG-8560 (Disco Corporation)
    Grinding Wheel: spindle 1 #600, spindle 2 #2000
    Grinding Thickness Grinding to 250 μm with spindle 1, then to 200 μm with spindle 2
    Back-grind Tape BT-150E-KL (Nitto Denko Co., Ltd.)

Dicing Conditions
    Device: DFD-651 (Disco Corporation)
    Dicing Blade: ZBC-ZH 205O-27HECC (Disco Corporation)
    Dicing Speed: 80 mm/sec
    Blade Rotation Speed: 40,000 rpm
    Cutting Water Flow Amount: 1 L/min
    Cutting Mode: A
    Cutting Method: single cut
    Index Size: 10 mm×10 mm
    Cutting Amount: 30 μm Pick-Up Conditions
    Device: FED-1870 (Shibaura Corporation)
    Pick-up speed: index 4
    Pick-up time: 100 msec
    Raise Amount: from 150 μm
    Index Amount: 3 mm
    Needle Disposition: 7×7 mm
    Needle R: 250 μm
    Collet Size: 9×9 mm

TABLE 1

| | Unit: parts by weight | | | | | | |
|---|---|---|---|---|---|---|---|
| Tg(K)* | BM 293 | 2EHM 263 | DM 208 | TDM 227 | ODM 311 | 2HEM 328 | 2IEM |
| Ex. 1 | | | 100.0 | | | 10.2 | 9.8 |
| Ex. 2 | 20.0 | | 80.0 | | | 11.8 | 11.3 |
| Ex. 3 | | 20.0 | 80.0 | | | 10.8 | 10.3 |
| Ex. 4 | | | 80.0 | | 20.0 | 9.7 | 9.3 |
| Ex. 5 | 40.0 | | 60.0 | | | 13.5 | 12.8 |
| Ex. 6 | | 40.0 | 60.0 | | | 11.4 | 10.9 |
| Ex. 7 | | | 60.0 | | 40.0 | 9.2 | 8.8 |
| Ex. 8 | | | 100.0 | | | 13.9 | 14.0 |
| Ex. 9 | | | 100.0 | | | 7.8 | 7.0 |
| Ex. 10 | | | | 100.0 | | 9.7 | 9.2 |
| Ex. 11 | | 20.0 | | 80.0 | | 10.4 | 9.9 |
| Ex. 12 | | 40.0 | | 60.0 | | 11.1 | 10.6 |
| Comp. Ex. 1 | | | 100.0 | | | 4.7 | 3.4 |
| Comp. Ex. 2 | | | 100.0 | | | 18.3 | 19.0 |
| Comp. Ex. 3 | 60.0 | | 40.0 | | | 15.1 | 14.4 |
| Comp. Ex. 4 | | 60.0 | 40.0 | | | 12.0 | 11.4 |
| Comp. Ex. 5 | | | 40.0 | | 60.0 | 8.7 | 8.3 |
| Comp. Ex. 6 | 60.0 | | | 40.0 | | 14.9 | 14.2 |
| Comp. Ex. 7 | | 100.0 | | | | 13.1 | 12.5 |
| Comp. Ex. 8 | | | | | 100.0 | 7.7 | 7.3 |

TABLE 2

| | Intermediate Comp. Calculation Tg (K) | Number of Double Bonds relative to Side Chain (%) | Handling from Wafer Mounting to Pick Up Result | Determination | Pick Up Height (μm) | Determination | Total Determination |
|---|---|---|---|---|---|---|---|
| Ex. 1 | 215 | 13.3 | No problems | ○ | 190 | ○ | ○ |
| Ex. 2 | 229 | 13.3 | | ○ | 230 | ○ | ○ |
| Ex. 3 | 224 | 13.3 | | ○ | 210 | ○ | ○ |
| Ex. 4 | 229 | 13.3 | | ○ | 170 | ○ | ○ |
| Ex. 5 | 243 | 13.3 | | ○ | 250 | ○ | ○ |
| Ex. 6 | 234 | 13.3 | | ○ | 240 | ○ | ○ |
| Ex. 7 | 245 | 13.3 | | ○ | 160 | ○ | ○ |
| Ex. 8 | 218 | 18.0 | | ○ | 170 | ○ | ○ |
| Ex. 9 | 214 | 10.0 | | ○ | 230 | ○ | ○ |
| Ex. 10 | 233 | 13.3 | | ○ | 190 | ○ | ○ |
| Ex. 11 | 240 | 13.3 | | ○ | 200 | ○ | Δ |
| Ex. 12 | 247 | 13.3 | | ○ | 230 | ○ | ○ |
| Comparative Examples | | | | | | | |
| 1 | 211 | 5.0 | No problems | ○ | 350 | x | x |
| 2 | 220 | 23.0 | Gelling of Polymerization of Intermediate Polymer | Δ | 140 | ○ | Δ |
| 3 | 260 | 13.3 | Pick-up by partial reinforcing with peeling cellophane tape from link during dicing | x | 330 | x | x |
| 4 | 245 | 13.3 | No problems | ○ | 310 | x | x |
| 5 | 264 | 13.3 | Wafer Non-attachment | x | Evaluation not possible | x | x |
| 6 | 269 | 13.3 | | x | | x | x |
| 7 | 269 | 13.3 | | x | | x | x |
| 8 | 312 | 13.3 | | x | | x | x |

TABLE 3

| | BA | 2EHA | DA | 2HEA | 2IEM |
|---|---|---|---|---|---|
| Tg(K)* | 219 | 203 | 288 | 258 | |
| Comp. Ex. 9 | | 100.0 | | 12.6 | 13.5 |
| Comp. Ex. 10 | | | 100.0 | 9.6 | 10.3 |
| Comp. Ex. 11 | 100.0 | | | 17.8 | 19.1 |
| Comp. Ex. 12 | 60.0 | | 40.0 | 14.5 | 15.6 |
| Comp. Ex. 13 | 40.0 | | 60.0 | 12.9 | 13.8 |
| Comp. Ex. 14 | 20.0 | | 80.0 | 11.2 | 12.0 |

Unit: parts by weight

Tg (K)* means documentary values for Tg in the homopolymers shown in Table 1 and Table 3.

BM: butylmethacrylate, Acrylester B (Mitsubishi Rayon Corporation)

2EHM: 2-ethylhexylmethacrylate, Light Ester EH (Kyoeisha chemical industry company)

DM: dodecylmethacrylate, EXEPARL L-MA (Kao Corporation)

TDM: tridecylmethacrylate (Tokyo Kasei Kogyo Corporation)

ODM: cctadecylmethacrylate (Tokyo Kasei Kogyo Corporation)

TABLE 4

| Comparative Examples | Intermediate Comp. Calculation Tg (K) | Number of Double Bonds relative to Side Chain (%) | Handling from Wafer Mounting to Pick Up Result | Determination | Pick Up Height (μm) | Determination | Total Determination |
|---|---|---|---|---|---|---|---|
| 9 | 215 | 13.3 | No problems | ○ | 280 | x | x |
| 10 | 229 | 13.3 | Wafer Non-attachment | x | Evaluation not possible | x | x |
| 11 | 224 | 13.3 | No problems | ○ | 400 | x | x |
| 12 | 229 | 13.3 | No problems | ○ | 370 | x | x |
| 13 | 243 | 13.3 | Pick-up by partial reinforcing with peeling cellophane tape from link during dicing | x | 250 | ○ | x |
| 14 | 234 | 13.3 | Wafer Non-attachment | x | Evaluation not possible | x | x |

2HEM: 2-hydroxyethylmethacrylate, acrylester HO (Mitsubishi Rayon Corporation)

2IEM: 2-isocyanatoethyl methacrylate, Karenz MOI (Showa Denko K.K)

BA: butyl acrylate (Toagosei Co. Ltd.)

2EHA: 2-ethyl hexyl acrylate, ethyl hexyl-2 acrylate (Toagosei Co. Ltd.)

DA: dodecyl acrylate (Tokyo Kasei Kogyo Corporation)

2HEA: 2-hydroxyethyl acrylate: Acryx HEA (Toagosei Co. Ltd.)

The radiation-curable adhesive composition and the adhesive sheet using the radiation-curable adhesive composition according to the present invention for example can not only be used in relation to semiconductor wafers, but also can be used for attachment in relation to various adherends such as semiconductor packages, ceramics, glass, and the like, and are useful in a wide range of applications as an adhesive sheet enabling repelling for various uses such as wafer dicing, wafer protection, temporary wafer fixing for used in processing step for such adherends, and in particular for a semiconductor wafer.

What is claimed is:

1. A radiation-curable adhesive composition comprising a base polymer as a principal base material, the base polymer includes structural units derived from at least a monomer A that has a functional group a;

a monomer B that is formed from a methacrylate monomer that has an alkyl group that includes at least 10 and no more than 17 carbon atoms; and a monomer C that has both a functional group c that reacts with the functional group a and a polymerizable carbon-carbon double bond group, and a main chain of the base polymer is configured from the monomer B and the monomer A, the proportion of the monomer B being at least 50 wt % of the total monomers configuring the main chain; and the base polymer includes a polymerizable carbon-carbon double bond group in a side chain as a result of a portion of the functional group a in the monomer A reacting and bonding with the functional group c in the monomer C.

2. The radiation-curable adhesive composition according to claim 1, wherein the polymer that configures a main chain from structural units derived from the monomer A and the monomer B has a calculated glass transition temperature that is calculated from a Fox equation at no more than 260 K.

3. The radiation-curable adhesive composition according to claim 1, wherein the functional group a is a hydroxyl group and the functional group c is an isocyanate group.

4. The radiation-curable adhesive composition according to claim 1, wherein the monomer C is 2-isocyanatoethyl acrylate and/or 2-isocyanatoethyl acrylate.

5. The radiation-curable adhesive composition according to claim 1, wherein the monomer A is at least one monomer selecting the group consisting of 2-hydroxyethyl methacrylate, 2-hydroxypropyl methacrylate and 6-hydroxyhexyl methacrylate.

6. The radiation-curable adhesive composition according to claim 1, wherein the monomer B is at least one monomer selecting the group consisting of dodecyl methacrylate and tridecyl methacrylate.

7. The radiation-curable adhesive composition according to claim 6, wherein the monomer B is dodecyl methacrylate.

8. The radiation-curable adhesive composition according to claim 1, wherein the number of polymerizable carbon-carbon double bonds introduced into the side chain that derived from the monomer C is at least 5% and no more than 20% of the total number of side chains in the base polymer.

9. An adhesive sheet comprising a adhesive layer including the radiation-curable adhesive composition according to claim 1.

10. The radiation-curable adhesive composition according to claim 1, wherein the number of polymerizable carbon-carbon double bonds introduced into the side chain that derived from the monomer C is at least 7% and no more than 18% of the total number of side chains in the base polymer.

11. The radiation-curable adhesive composition according to claim 1, wherein both of monomer A and monomer C are methacrylate monomers.

* * * * *